US010305513B2

(12) United States Patent
Lee et al.

(10) Patent No.: US 10,305,513 B2
(45) Date of Patent: May 28, 2019

(54) APPARATUS AND METHOD FOR DETERMINING LOG LIKELIHOOD VALUES OF NODES IN COMMUNICATION SYSTEM SUPPORTING LOW DENSITY PARITY CHECK CODE

(71) Applicants: Samsung Electronics Co., Ltd., Gyeonggi-do (KR); KOREA UNIVERSITY RESEARCH AND BUSINESS FOUNDATION, Seoul (KR)

(72) Inventors: Myeong-Woo Lee, Hwaseong-si (KR); Young-Kil Suh, Seoul (KR); Jun Heo, Seoul (KR); Jong-Hyun Baik, Seongnam-si (KR)

(73) Assignees: Samsung Electronics Co., Ltd., Suwon-si (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/456,315

(22) Filed: Mar. 10, 2017

(65) Prior Publication Data
US 2017/0264316 A1 Sep. 14, 2017

(30) Foreign Application Priority Data

Mar. 10, 2016 (KR) .................. 10-2016-0028890

(51) Int. Cl.
*H03M 13/11* (2006.01)
*H04L 1/20* (2006.01)
(Continued)

(52) U.S. Cl.
CPC .......... *H03M 13/1125* (2013.01); *H04L 1/20* (2013.01); *H03M 13/1105* (2013.01);
(Continued)

(58) Field of Classification Search
CPC .......... H03M 13/1105; H03M 13/1117; H03M 13/1125; H03M 13/1128; H03M 13/1131;
(Continued)

(56) References Cited

U.S. PATENT DOCUMENTS

2008/0195898 A1* 8/2008 Savin ................. H03M 13/1111
714/699
2011/0078548 A1* 3/2011 Xin .................... H03M 13/1105
714/807

(Continued)

OTHER PUBLICATIONS

Sarajlić, L. Liu and O. Edfors, "Modified forced convergence decoding of LDPC codes with optimized decoder parameters," 2015 IEEE 26th Annual International Symposium on Personal, Indoor, and Mobile Radio Communications (PIMRC), Hong Kong, 2015, pp. 440-445.*

*Primary Examiner* — Christian M Dorman

(57) ABSTRACT

The present disclosure relates to a pre-5th-generation (5G) or 5G communication system to be provided for supporting higher data rates beyond 4th-generation (4G) communication system such as a long term evolution (LTE). A method of a receiving apparatus in a communication system supporting a low density parity check (LDPC) code is provided. The method includes deactivating variable nodes of which absolute values of log likelihood ratio (LLR) values are greater than or equal to a first threshold value; changing LLR values of variable nodes of which absolute values of LLR values are less than a second threshold value among variable nodes other than the deactivated variable nodes to a preset value, and detecting LLR values of check nodes based on LLR values of the variable nodes other than the deactivated variable nodes.

18 Claims, 11 Drawing Sheets

(51) Int. Cl.
  *H04L 1/00* (2006.01)
  *H03M 13/00* (2006.01)
  *H03M 13/39* (2006.01)

(52) U.S. Cl.
  CPC ..... *H03M 13/1117* (2013.01); *H03M 13/1128* (2013.01); *H03M 13/1131* (2013.01); *H03M 13/3994* (2013.01); *H03M 13/6502* (2013.01); *H04L 1/0045* (2013.01); *H04L 1/0051* (2013.01); *H04L 1/0053* (2013.01); *H04L 1/0057* (2013.01); *H04L 1/0061* (2013.01)

(58) Field of Classification Search
  CPC .......... H03M 13/3994; H03M 13/6502; H04L 1/0045; H04L 1/0051; H04L 1/0053; H04L 1/0057; H04L 1/0061; H04L 1/20
  See application file for complete search history.

(56) References Cited

U.S. PATENT DOCUMENTS

2015/0303944 A1* 10/2015 Sunwoo ............. H03M 13/1131 714/752
2016/0224482 A1* 8/2016 Murata ................... G06F 13/24

* cited by examiner

<case 1>

<case 2>

APPARATUS AND METHOD FOR DETERMINING LOG LIKELIHOOD VALUES OF NODES IN COMMUNICATION SYSTEM SUPPORTING LOW DENSITY PARITY CHECK CODE

CROSS-REFERENCE TO RELATED APPLICATION(S) AND CLAIM OF PRIORITY

The present application is related to and claims the benefit under 35 U.S.C. § 119(a) of a Korean patent application filed in the Korean Intellectual Property Office on Mar. 10, 2016, and assigned Serial No. 10-2016-0028890, the entire disclosure of which is incorporated herein by reference.

TECHNICAL FIELD

The present disclosure relates to an apparatus and method for receiving a signal in a communication system supporting a low density parity check (LDPC) code.

BACKGROUND

To meet the demand for wireless data traffic, which has increased since deployment of 4th-generation (4G) communication systems, efforts have been made to develop an improved 5th-generation (5G) or pre-5G communication system. Therefore, the 5G or pre-5G communication system is also called a 'beyond 4G network' or a 'post long-term evolution (LTE) system'.

It is considered that the 5G communication system will be implemented in millimeter wave (mmWave) bands, e.g., 60 GHz bands, so as to accomplish higher data rates. To reduce propagation loss of radio waves and increase a transmission distance, a beam forming technique, a massive multiple-input multiple-output (MIMO) technique, a full dimensional MIMO (FD-MIMO) technique, an array antenna technique, an analog beam forming technique, and a large scale antenna technique are discussed in 5G communication systems.

In addition, in 5G communication systems, development for system network improvement is under way based on advanced small cells, cloud radio access networks (RANs), ultra-dense networks, a device-to-device (D2D) communication, a wireless backhaul, a moving network, a cooperative communication, coordinated multi-points (CoMP), reception-end interference cancellation, and the like.

In the 5G system, a hybrid frequency shift keying (FSK) and quadrature amplitude modulation (QAM) modulation (FQAM) and a sliding window superposition coding (SWSC) as an advanced coding modulation (ACM) scheme, and a filter bank multi carrier (FBMC) scheme, a non-orthogonal multiple Access (NOMA) scheme, and a sparse code multiple access (SCMA) scheme as an advanced access technology have been developed.

Firstly, various channel codes are used in a communication system, and a typical one of the various channel codes is a low density parity check (LDPC) code.

The LDPC code is an error correction code which has encoding complexity and decoding complexity which are really implementable and performance almost similar to theoretical channel capacity. The LDPC code may be designed such that the LDPC code has a structure suitable for parallel processing and error correction performance of the LDPC code is good on a real channel. So, the LDPC code has been used in various communication systems such as institute of electrical and electronics engineers (IEEE) 802.11n/ad wireless Fidelity® (Wi-Fi®) communication system, an IEEE 802.16e WiMAX communication system, a digital video broadcasting-satellite-second generation (DVB-S2) communication system which is based on a DVB-S2 standard, a digital video broadcasting-terrestrial-second generation (DVB-T2) communication system which is based on a DVB-T2 standard, a digital video broadcasting-cable-second generation (DVB-C2) communication system which is based on a DVB-C2 standard, an advanced television system committee (ATSC) 3.0 communication system which is based on an ATSC 3.0 standard, a G.hn communication system which is based on a G.hn standard as a home network standard, and/or the like.

Further, fast decoding for the LDPC code is possible, so a 5G mobile communication system which requires a relatively high code rate has actively considered to use the LDPC code as an error correction code. Here, the LDPC code has a characteristic of recovering a message through an iterative decoding process. In the iterative decoding process, computations between a variable node and a check node are sequentially performed, and the iterative decoding process is performed until a predetermined criterion is satisfied.

Meanwhile, a main purpose of a 5G mobile communication is data transmission of several Gbps. Compared with a 4G mobile communication supporting data transmission of several hundred Mbps, a data rate of 5G the mobile communication is at least increased 10 times, so a physical layer of each of a mobile station (MS) and a base station (BS) needs to receive and process more signals during a preset unit time.

Meanwhile, more hardware resources need to be used for increasing data throughput of a receiver. So, a hardware mounting area is increased, and more power is consumed. A 5G mobile communication system has considered various schemes for decreasing power consumed for an error correction code by considering a complex communication environment and various functions of a user device. Further, an iterative process including a plurality of variable node computations and a plurality of check node computations is performed on the LDPC code. So, if the LDPC code is used as an error correction code, power consumed for decoding the LDPC code is significantly great. As described above, a plurality of variable node computations and a plurality of check node computations are required for decoding the LDPC code, a size of a memory required for decoding the LDPC code is significantly large.

So, in a case that a BS and an MS are really implemented in a 5G mobile communication system supporting an LDPC code, increase of a hardware mounting area and consumed power may be important issue which needs to be solved.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide an apparatus and method for receiving a signal in a communication system supporting an LDPC code.

Another aspect of the present disclosure is to propose an apparatus and method for receiving a signal thereby decreasing power consumption in a communication system supporting an LDPC code.

Another aspect of the present disclosure is to propose an apparatus and method for receiving a signal thereby decreasing memory consumption in a communication system supporting an LDPC code.

Another aspect of the present disclosure is to propose an apparatus and method for receiving a signal thereby decreasing decoding complexity in a communication system supporting an LDPC code.

Another aspect of the present disclosure is to propose an apparatus and method for receiving a signal thereby decreasing variable node computation amount in a communication system supporting an LDPC code.

Another aspect of the present disclosure is to propose an apparatus and method for receiving a signal thereby decreasing check node computation amount in a communication system supporting an LDPC code.

Another aspect of the present disclosure is to propose a signal receiving apparatus and method for adaptively adjusting a log likelihood ratio (LLR) threshold value used in an iterative decoding process in a communication system supporting an LDPC code.

In accordance with an aspect of the present disclosure, a method of a receiving apparatus in a communication system supporting a low density parity check (LDPC) code is provided. The method includes deactivating variable nodes of which absolute values of log likelihood ratio (LLR) values are greater than or equal to a first threshold value; changing LLR values of variable nodes of which absolute values of LLR values are less than a second threshold value among variable nodes other than the deactivated variable nodes to a preset value; and detecting LLR values of check nodes based on LLR values of the variable nodes other than the deactivated variable nodes.

In accordance with another aspect of the present disclosure, a receiving apparatus in a communication system supporting a low density parity check (LDPC) code is provided. The receiving apparatus includes a processor configured to deactivate variable nodes of which absolute values of log likelihood ratio (LLR) values are greater than or equal to a first threshold value, to change LLR values of variable nodes of which absolute values of LLR values are less than a second threshold value among variable nodes other than the deactivated variable nodes to a preset value, and to detect LLR values of check nodes based on LLR values of the variable nodes other than the deactivated variable nodes.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system, a processor or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

Figure 1:
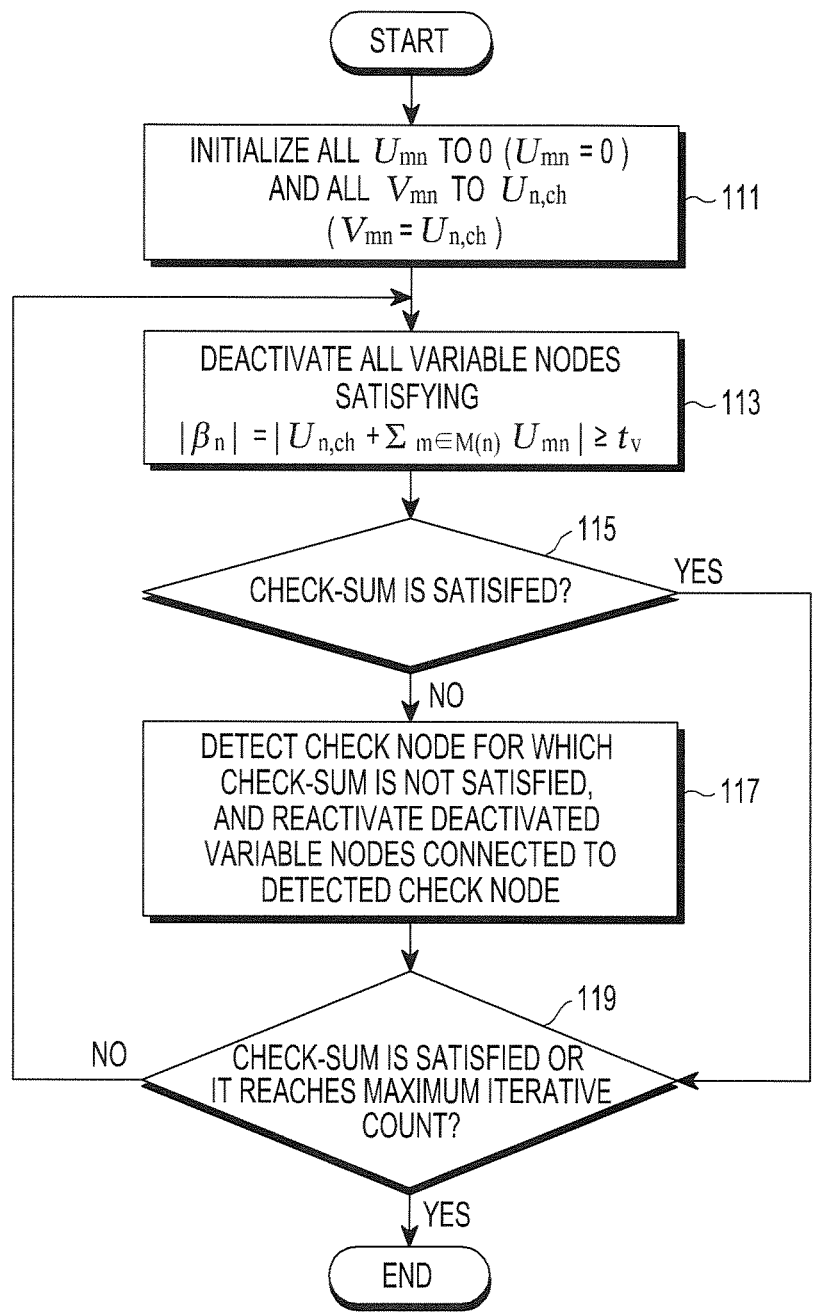
FIG. 1 schematically illustrates an LDPC decoding process which is based on a forced convergence scheme in a communication system supporting an LDPC code according to an embodiment of the present disclosure.

FIGS. 1 through 17, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept. The term "and/or" used herein includes any and all combinations of one or more of the associated listed items.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

The terms used herein, including technical and scientific terms, have the same meanings as terms that are generally understood by those skilled in the art, as long as the terms are not differently defined. It should be understood that terms defined in a generally-used dictionary have meanings coinciding with those of terms in the related technology.

According to various embodiments of the present disclosure, an electronic device may include communication functionality. For example, an electronic device may be a smart phone, a tablet personal computer (PC), a mobile phone, a video phone, an e-book reader, a desktop PC, a laptop PC, a netbook PC, a personal digital assistant (PDA), a portable multimedia player (PMP), an mp3 player, a mobile medical device, a camera, a wearable device (e.g., a head-mounted device (HMD), electronic clothes, electronic braces, an electronic necklace, an electronic accessory, an electronic tattoo, or a smart watch), and/or the like.

According to various embodiments of the present disclosure, an electronic device may be a smart home appliance with communication functionality. A smart home appliance may be, for example, a television, a digital video disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., magnetic resonance angiography (MRA) device, a magnetic resonance imaging (MRI) device, computed tomography (CT) device, an imaging device, or an ultrasonic device), a navigation device, a global positioning system (GPS) receiver, an event data recorder (EDR), a flight data recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

According to various embodiments of the present disclosure, a signal transmitting apparatus or a signal receiving apparatus may be, for example, a mobile station (MS). The term MS may be interchangeable with the term user equipment (UE), device, subscriber station, and/or the like.

According to various embodiments of the present disclosure, a signal transmitting apparatus or a signal receiving apparatus may be, for example, a base station (BS). The term BS may be interchangeable with the term node B, evolved node B (eNB), evolved universal terrestrial radio access network (E-UTRAN) node B (eNB), access point (AP), and/or the like.

According to various embodiments of the present disclosure, the term signal transmitting apparatus may be interchangeable with the term transmitting apparatus, and/or the like.

According to various embodiments of the present disclosure, the term signal receiving apparatus may be interchangeable with the term receiving apparatus, and/or the like.

An embodiment of the present disclosure proposes an apparatus and method for receiving a signal in a communication system supporting a low density parity check (LDPC) code.

An embodiment of the present disclosure proposes an apparatus and method for receiving a signal thereby decreasing power consumption in a communication system supporting an LDPC code.

An embodiment of the present disclosure proposes an apparatus and method for receiving a signal thereby decreasing memory consumption in a communication system supporting an LDPC code.

An embodiment of the present disclosure proposes an apparatus and method for receiving a signal thereby decreasing decoding complexity in a communication system supporting an LDPC code.

An embodiment of the present disclosure proposes an apparatus and method for receiving a signal thereby decreasing variable node computation amount in a communication system supporting an LDPC code.

An embodiment of the present disclosure proposes an apparatus and method for receiving a signal thereby decreasing check node computation amount in a communication system supporting an LDPC code.

An embodiment of the present disclosure proposes a signal receiving apparatus and method for adaptively adjusting a log likelihood ratio (LLR) threshold value used in an iterative decoding process in a communication system supporting an LDPC code.

An apparatus and method proposed in various embodiments of the present disclosure may be applied to various communication systems such as a long term evolution (LTE) mobile communication system, an LTE-advanced (LTE-A) mobile communication system, a licensed-assisted access (LAA)-LTE mobile communication system, a high speed downlink packet access (HSDPA) mobile communication system, a high speed uplink packet access (HSUPA) mobile communication system, a high rate packet data (HRPD) mobile communication system proposed in a 3rd generation partnership project 2 (3GPP2), a wideband code division multiple access (WCDMA) mobile communication system proposed in the 3GPP2, a code division multiple access (CDMA) mobile communication system proposed in the 3GPP2, an institute of electrical and electronics engineers (IEEE) 802.16m communication system, an IEEE 802.16e communication system, an evolved packet system (EPS), and a mobile internet protocol (Mobile IP) system, a digital video broadcast system such as a mobile broadcast service such as a digital multimedia broadcasting (DMB) service, a digital video broadcasting-handheld (DVP-H), an advanced television systems committee-mobile/handheld (ATSC-M/H) service, and the like, and an internet protocol television (IPTV), a moving picture experts group (MPEG) media transport (MMT) system and/or the like.

Schemes of decreasing power consumed for decoding an LDPC code may include a forced convergence scheme of decreasing amount of variable node computation and check node computation included in an iterative decoding process and a self-corrected scheme of decreasing an iteration count of an iterative decoding process.

Firstly, a forced convergence scheme will be described below.

The forced convergence scheme has been proposed for decreasing complexity of an LDPC decoder. If an absolute value of an LLR value for a specific variable node in an iterative decoding process is greater than or equal to a preset threshold value, the LDPC decoder does not update the LLR value for the specific variable node, that is, the LDPC decoder deactivates the specific variable node, so decoding complexity is decreased.

The forced convergence scheme may be expressed as Equation (1).

$$(|\beta_n^{(i)}| \geq t_v) \quad V_{mn}^{(i+1)} \leftarrow V_{mn}^{(i)}$$
$$(|\beta_n^{(i)}| < t_v) \quad V_{mn}^{(i+1)} \leftarrow V_{mn}^{(i+1)}$$

Equation (1)

In Equation (1), $\beta_n^{(i)}$ denotes an LLR value for hard decision of the n-th variable node on the ith iteration, and tv denotes a threshold value for variable node deactivation. Here, tv is a positive real number. In Equation (1), $V_{mn}^{(i)}$ denotes a variable-to-check (V2C) LLR value transferred from the n-th variable node to the m-th check node on the i-th iteration.

In the forced convergence scheme, whether parity check is satisfied is continuously checked for overcoming performance degradation occurred due to variable node deactivation. If parity check including the deactivated variable node is not satisfied, the LDPC decoder reactivates the deactivated variable node.

An LDPC decoding process which is based on a forced convergence scheme in a communication system supporting an LDPC code according to an embodiment of the present disclosure will be described with reference to FIG. 1.

FIG. 1 schematically illustrates an LDPC decoding process which is based on a forced convergence scheme in a communication system supporting an LDPC code according to an embodiment of the present disclosure.

Referring to FIG. 1, an LDPC decoder initializes all Umn to 0 and all Vmn to Un,ch at operation 111, and proceeds to operation 113. Here, Umn denotes a check-to-variable (C2V) LLR value transferred from the m-th check node to the n-th variable node, and Vmn denotes a V2C LLR value transferred from the n-th variable node to the m-th check node. The LDPC decoder deactivates all variable nodes satisfying a preset criterion, e.g., $|\beta_n|=|U_{n,ch}+\Sigma_{m\in M(n)} U_{mn}|\geq t_v$, at operation 113, and proceeds to operation 115. Here, σn denotes an LLR value for hard decision of the n-th variable node, and $t_v$ denotes a threshold value for variable node deactivation. Further, M(n) denotes a set of check nodes connected to the n-th variable node. The LDPC decoder determines whether a check-sum is satisfied at operation 115. If the check-sum is satisfied, the LDPC decoder proceeds to operation 119.

If the check-sum is not satisfied, the LDPC decoder proceeds to operation 117. The LDPC decoder detects a check node for which the check-sum is not satisfied, and reactivates deactivated variable nodes among variable nodes connected to the detected check node at operation 117, and proceeds to operation 119. The LDPC decoder determines whether a check-sum is satisfied or it reaches a maximum iterative count at operation 119. Here, the maximum iterative count denotes a maximum value of iterations which may be performed in an iterative decoding process performed by the LDPC decoder.

If the check-sum is satisfied or it reaches the maximum iterative count, the LDPC decoder terminates an LDPC decoding process. If the check-sum is not satisfied or it does not reach the maximum iterative count, the LDPC decoder returns to operation 113.

Next, a self-corrected scheme will be described below.

The self-corrected scheme has been proposed for enhancing decoding performance in a minimum-sum (Min-Sum) scheme as one of LDPC decoding algorithms.

Meanwhile, an LDPC decoder performs an iterative decoding process of transmitting and receiving information between a variable node and a check node. In the iterative decoding process, the LDPC decoder compares a V2C LLR value in a current decoding process with a V2C LLR value in a previous decoding process. If a sign of the V2C LLR value in the current decoding process is different from a sign of the V2C LLR value in the previous decoding process, the LDPC decoder determines that the V2C LLR value in the current decoding process is information of which a reliability is low, and changes the V2C LLR value in the current decoding process to zero. Here, the self-corrected scheme may be expressed as Equation (2).

$$(V_{mn}^{(i)} \cdot V_{mn}^{(i-1)} < 0) V_{mn}^{(i)} = 0$$

$$(V_{mn}^{(i)} \cdot V_{mn}^{(i-1)} \geq 0) V_{mn}^{(i)} = U_{n,ch}^{(0)} + \Sigma_{m' \in M(n) \setminus m} U_{mm'n}^{(i)} \quad \text{Equation (2)}$$

In Equation (2), $U_{n,ch}^{(0)}$ denotes a channel LLR value input from the n-th variable node, and $U_{mm'n}^{(i)}$ denotes a C2V LLR value transferred from the m-th check node to the n-th variable node on the i-th iteration.

Upon receiving a V2C LLR value which is equal to 0, a check node omits information of a variable node with a low reliability to enhance performance of a Min-Sum decoding scheme.

An LDPC decoding process which is based on a self-corrected scheme in a communication system supporting an LDPC code according to an embodiment of the present disclosure will be described with reference to FIG. 2.

Figure 2:
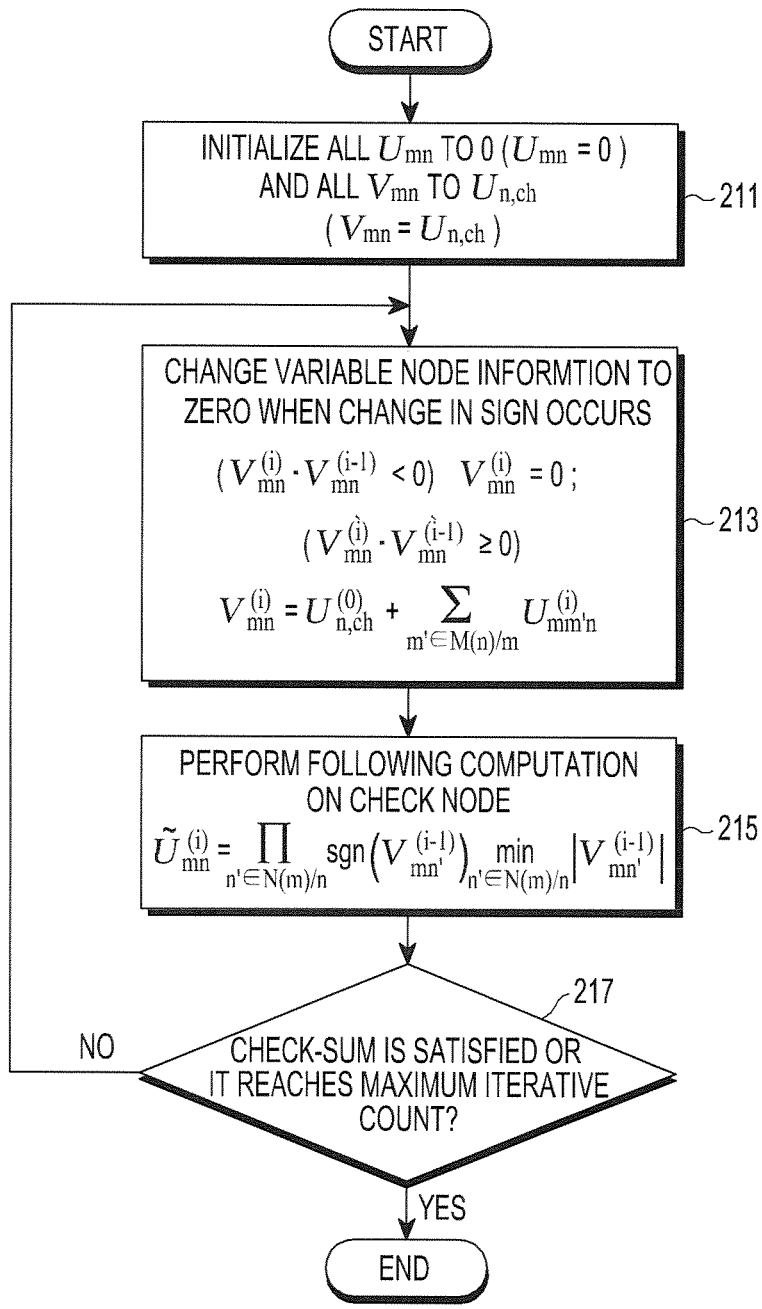
FIG. 2 schematically illustrates an LDPC decoding process which is based on a self-corrected scheme in a communication system supporting an LDPC code according to an embodiment of the present disclosure.

FIG. 2 schematically illustrates an LDPC decoding process which is based on a self-corrected scheme in a communication system supporting an LDPC code according to an embodiment of the present disclosure.

Referring to FIG. 2, operation 211 in FIG. 2 is the same as operation 111 in FIG. 1, and a detailed description thereof will be omitted herein.

Meanwhile, if a sign of a V2C LLR value in a current decoding process is different from a sign of a V2C LLR value in a previous decoding process, that is, if $V_{mn}^{(i)} \cdot V_{mn}^{(i-1)} < 0$, an LDPC decoder changes the V2C LLR value in the current decoding process to zero, and proceeds to operation 215. If the sign of the V2C LLR value in the current decoding process is not different from the sign of the V2C LLR value in the previous decoding process, that is, if $V_{mn}^{(i)} \cdot V_{mn}^{(i-1)} \geq 0$, the LDPC decoder updates $V_{mn}^{(i)}$ to $V_{mn}^{(i)} = U_{n,ch}^{(0)} + \Sigma_{m' \in M(n) \setminus m} U_{mm'n}^{(i)}$, and proceeds to operation 215.

The LDPC decoder performs computation expressed as Equation (3) on check nodes at operation 215, and proceeds to operation 217.

$$\tilde{U}_{mn}^{(i)} = \prod_{n' \in N(m) \setminus n} \text{sgn}(V_{mn'}^{(i-1)}) \min_{n' \in N(m) \setminus n} |V_{mn'}^{(i-1)}| \quad \text{Equation (3)}$$

Further, operation 217 in FIG. 2 is the same as operation 119 in FIG. 1, and a detailed description thereof will be omitted herein.

In the forced convergence scheme, the LDPC decoder needs to continuously check whether a parity check criterion is satisfied, and requires a flag indicating whether each of all variable nodes connected to a check node is activated in order to use the check result for determining whether a variable node is activated. In the forced convergence scheme, if a variable node is excluded from an iterative decoding process according to an order by which a variable node LLR value converges, a new circuit always needs to be configured, so it is difficult to really implement the forced convergence scheme.

In the self-corrected scheme, in an iterative decoding process, a V2C LLR value in a current repetition is compared with a V2C LLR value in a previous repetition. If a sign of the V2C LLR value in the current repetition is different from the V2C LLR value in the previous repetition, the V2C LLR value in the current repetition is changed to zero. So, upon inputting a V2C LLR value which is equal to zero, a check node may significantly decrease computation amount of the check node. In a real channel environment, a case that a V2C LLR value is changed to zero occurs in a very low frequency, so effect according to decrease of check node computation amount is very small, and each variable node needs to store a V2C LLR value in a previous iteration for checking whether a sign of a V2C LLR value in a current iteration is different from a sign of a V2C LLR value in a previous iteration.

So, an embodiment of the present disclosure proposes a signal receiving scheme of adaptively adjusting an LLR threshold value used in an iterative decoding process to decrease variable node computation amount and check node computation amount in a communication system supporting an LDPC code.

An LDPC decoding process proposed in an embodiment of the present disclosure is based on a Min-Sum scheme as one of iterative decoding schemes which are based on soft decision on a bipartite graph of a parity check matrix. Further, an embodiment of the present disclosure proposes a threshold value for decreasing variable node computation and a threshold value for decreasing check node computation.

A variable node deactivating scheme in a communication system supporting an LDPC code according to an embodiment of the present disclosure will be described with reference to FIG. 3.

Figure 3:
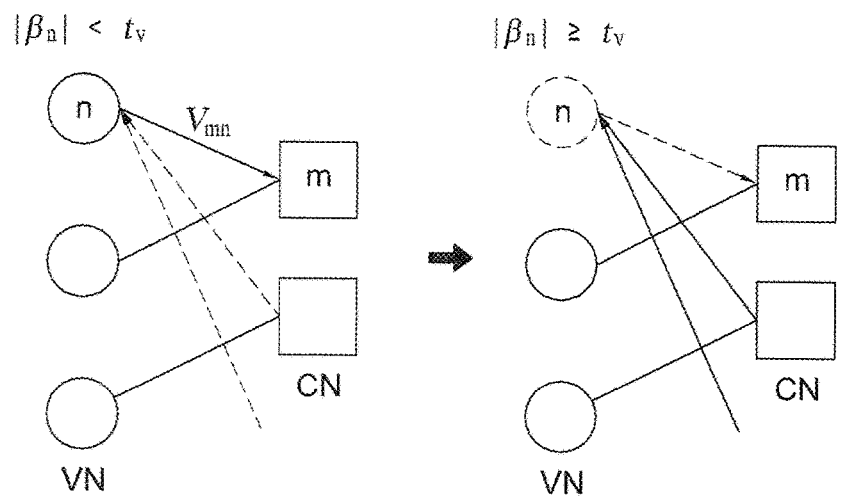
FIG. 3 schematically illustrates a variable node deactivating scheme in a communication system supporting an LDPC code according to an embodiment of the present disclosure.

FIG. 3 schematically illustrates a variable node deactivating scheme in a communication system supporting an LDPC code according to an embodiment of the present disclosure.

Referring to FIG. 3, an LDPC decoder determines a threshold value for variable node deactivation, i.e., a threshold value $t_v$ used for deactivating a variable node, and deactivates all variable nodes satisfying a criterion in Equation (4).

$$|\beta_n| = |U_{n,ch} + \Sigma_{m \in M(n)} U_{mn}| \geq t_v \quad \text{Equation (4)}$$

In Equation (4), $\beta n$ denotes an LLR value for hard decision of the n-th variable node, Umn denotes a C2V LLR value transferred from the m-th check node to the n-th variable node, and $U_{n,ch}$ denotes a channel LLR value input to the n-th variable node.

As shown in FIG. 3, if an absolute value of an LLR value for hard decision of the n-th variable node is greater than or equal to $t_v$ in an iterative decoding process, the LDPC decoder does not update an LLR value for the n-th variable node any more. That is, if the absolute value of the LLR value for the hard decision of the n-th variable node is greater than or equal to $t_v$ in the iterative decoding process, the LDPC decoder deactivates the n-th variable node, and this may be expressed as Equation (5).

$$\begin{aligned}(\text{If } |\beta_n| \geq t_v) \quad V_{mn}^{(i)} &\leftarrow V_{mn}^{(i)} \\ (\text{If } |\beta_n| < t_v) \quad V_{mn}^{(i+1)} &\leftarrow V_{mn}^{(i)}\end{aligned} \qquad \text{Equation (5)}$$

In Equation (5), $V_{mn}^{(i+1)}$ denotes a V2C LLR value transferred from the n-th variable node to the m-th check node on the i+1 iteration.

A variable node deactivating scheme in a communication system supporting an LDPC code according to an embodiment of the present disclosure has been described with reference to FIG. 3, and a scheme of adaptively adjusting a threshold value for variable node deactivation in a communication system supporting an LDPC code according to an embodiment of the present disclosure will be described with reference to FIG. 4.

Figure 4:
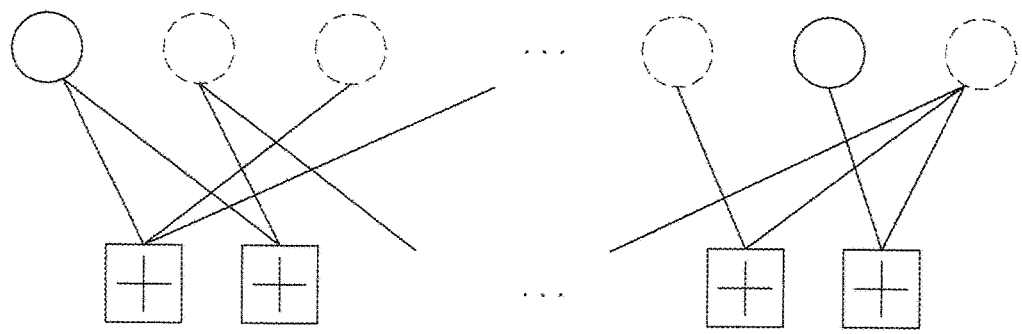
FIG. 4 schematically illustrates a scheme of adaptively adjusting a threshold value for variable node deactivation in a communication system supporting an LDPC code according to an embodiment of the present disclosure.

FIG. 4 schematically illustrates a scheme of adaptively adjusting a threshold value for variable node deactivation in a communication system supporting an LDPC code according to an embodiment of the present disclosure.

Referring to FIG. 4, an LDPC decoder adaptively controls a threshold value tv for variable node deactivation based on a threshold value ω for a ratio of deactivated variable nodes on a bipartite graph of an LDPC code, i.e., variable nodes expressed with a dotted line in FIG. 4, and this will be described below.

Firstly, if the ratio of the deactivated variable nodes is less than the threshold value ω, the LDPC decoder decreases the threshold value ω.

Secondly, if the ratio of the deactivated variable nodes is greater than or equal to the threshold value ω, the LDPC decoder increases the threshold value ω.

The LDPC decoder may adaptively adjust the threshold value ω. If the threshold value ω is decreased, a frequency in which the threshold value ω is changed is increased, so variable node computation amount may be increased. If the threshold value ω is increased, the frequency in which the threshold value ω is changed is decreased, so the variable node computation amount may be decreased.

A scheme of adaptively adjusting a threshold value for variable node deactivation in a communication system supporting an LDPC code according to an embodiment of the present disclosure has been described with reference to FIG. 4, and an inner structure of a unit of measuring a degree of saturation for a deactivated node (MDSDN) in a communication system supporting an LDPC code according to an embodiment of the present disclosure will be described with reference to FIG. 5.

Figure 5:
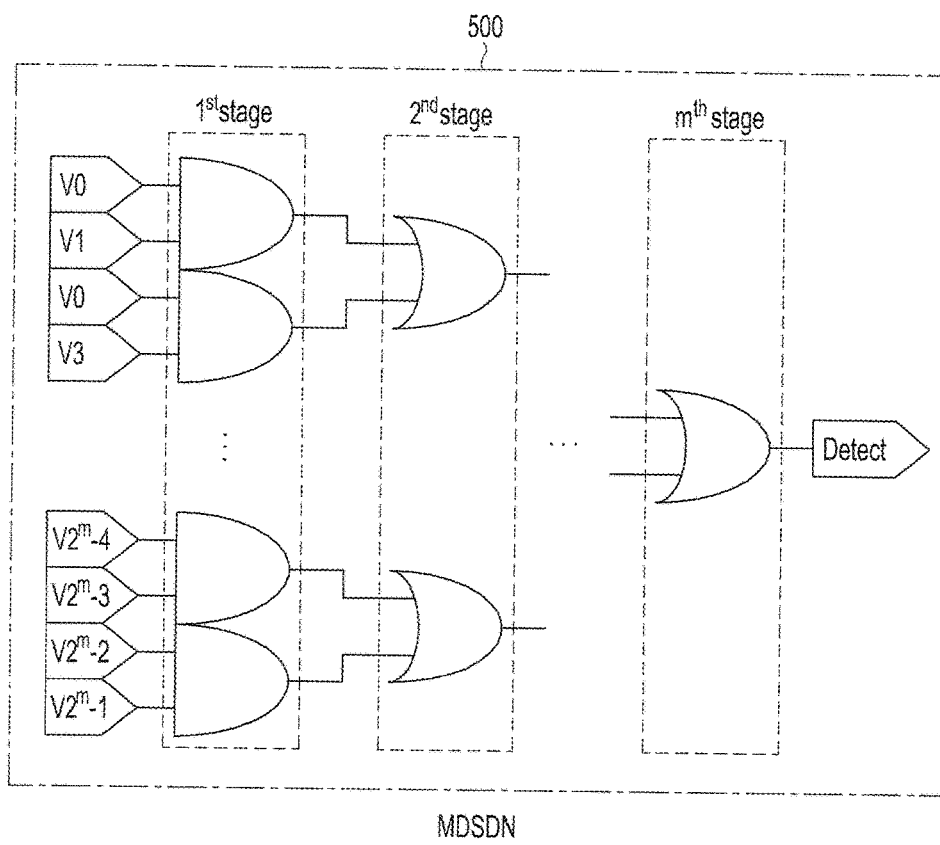
FIG. 5 schematically illustrates an inner structure of an MDSDN in a communication system supporting an LDPC code according to an embodiment of the present disclosure.

FIG. 5 schematically illustrates an inner structure of an MDSDN in a communication system supporting an LDPC code according to an embodiment of the present disclosure.

Referring to FIG. 5, an MDSDN 500 includes m stages, odd stages are implemented with AND gates, and even stages are implemented with OR gates. That is, the MDSDN 500 is implemented with a logical circuit which is based on a hard decision value for each of variable nodes.

In an embodiment of the present disclosure, if a ratio of 1 of a binary vector of a length 2m is equal to a threshold value ω for a ratio of variable nodes, the MDSDN 500 is implemented such that a computation result of the MDSDN 500 becomes a preset value, e.g., 1 with a relatively high probability.

The MDSDN 500 selects 2m sampled variable nodes as a sample, and estimates a degree of saturation for deactivated node (DSDN). For example, a DSDN may denote a ratio of deactivated nodes to all nodes.

If a DSDN is measured as described in an embodiment of the present disclosure, a result of comparing overhead due to a variable node reactivating criterion with overhead in a forced convergence scheme as described in FIG. 1 will be described below.

In the forced convergence scheme as described in FIG. 1, a flag indicating whether each of variable nodes connected to a check node is activated is required, so flags of which the number is equal to the number of edges is required if the number of variable nodes on a bipartite graph of an LDPC code is n. Here, the number of edges is code rate x average check node degree×n.

In a case that it is possible to measure a DSDN with a scheme as described in FIG. 5, total n comparing logics are required, so it will be understood that overhead due to a variable node reactivating criterion is significantly decreased.

An inner structure of an MDSDN in a communication system supporting an LDPC code according to an embodiment of the present disclosure has been described with reference to FIG. 5, and an example of a change in the number of sampled variable nodes used in an MDSDN in a communication system supporting an LDPC code according to an embodiment of the present disclosure will be described with reference to FIG. 6.

Figure 6:
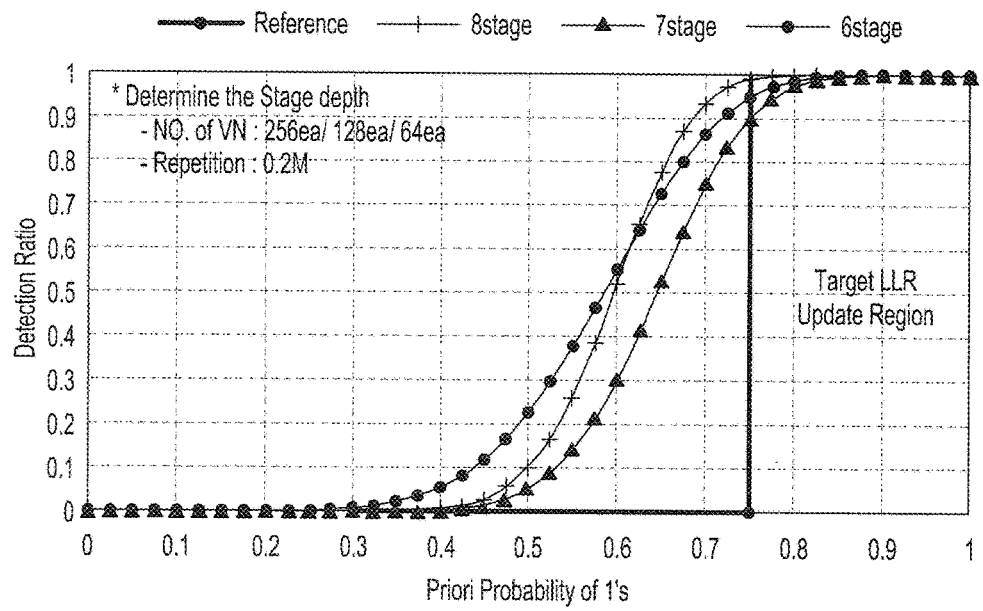
FIG. 6 schematically illustrates an example of a change in the number of sampled variable nodes used in an MDSDN in a communication system supporting an LDPC code according to an embodiment of the present disclosure.

FIG. 6 schematically illustrates an example of a change in the number of sampled variable nodes used in an MDSDN in a communication system supporting an LDPC code according to an embodiment of the present disclosure.

Referring to FIG. 6, the number of sampled variable nodes used in an MDSDN in FIG. 6 indicates the number of sampled variable nodes used in an MDSDN in a case that a random sampling scheme is applied. As shown in FIG. 6, if m is 7 (m=7), it will be understood that 0.75 which is a relatively suitable DSDN is measured (ω≈0.75).

An example of a change in the number of sampled variable nodes used in an MDSDN in a communication system supporting an LDPC code according to an embodiment of the present disclosure has been described with reference to FIG. 6, and another example of a change in the number of sampled variable nodes used in an MDSDN in a communication system supporting an LDPC code according to an embodiment of the present disclosure will be described with reference to FIG. 7.

Figure 7:
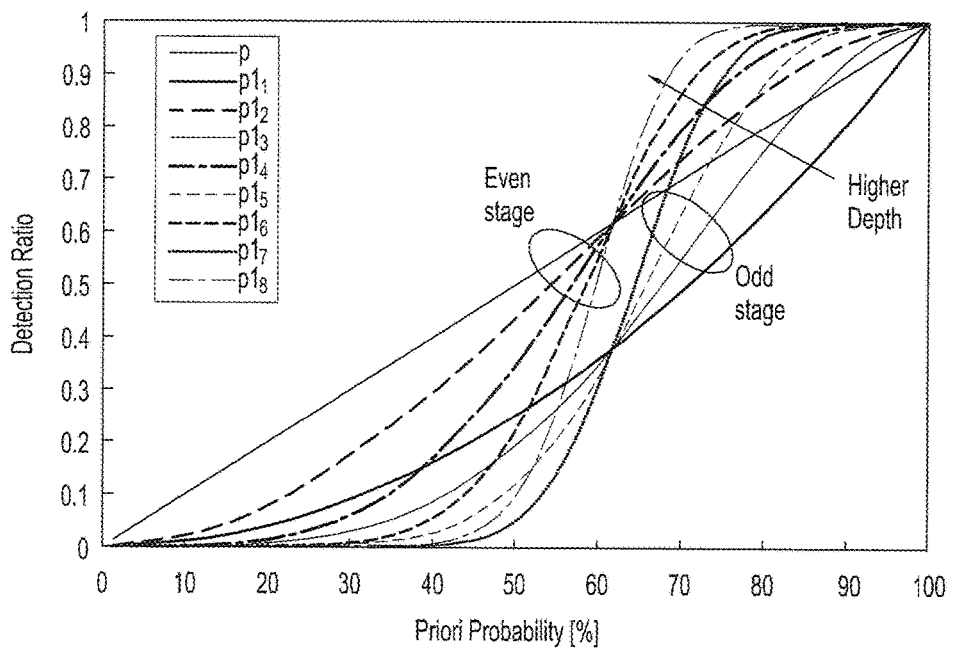
FIG. 7 schematically illustrates another example of a change in the number of sampled variable nodes used in an MDSDN in a communication system supporting an LDPC code according to an embodiment of the present disclosure.

FIG. 7 schematically illustrates another example of a change in the number of sampled variable nodes used in an MDSDN in a communication system supporting an LDPC code according to an embodiment of the present disclosure.

Referring to FIG. 7, the number of sampled variable nodes used in an MDSDN in FIG. 7 indicates the number of sampled variable nodes used in an MDSDN in a case that a low degree selection scheme is applied. As shown in FIG. 7, if m is 6 (m=6), it will be understood that 0.65 which is a relatively suitable DSDN is measured (ω≈0.65).

Another example of a change in the number of sampled variable nodes used in an MDSDN in a communication system supporting an LDPC code according to an embodiment of the present disclosure has been described with reference to FIG. 7, and a scheme of determining a threshold value for variable node deactivation in a communication system supporting an LDPC code according to an embodiment of the present disclosure will be described with reference to FIG. 8.

Figure 8:
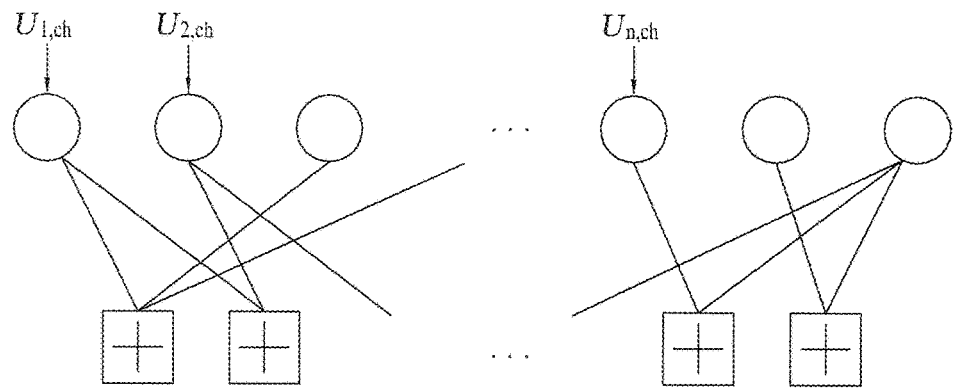
FIG. 8 schematically illustrates a scheme of determining a threshold value for variable node deactivation in a communication system supporting an LDPC code according to an embodiment of the present disclosure.

FIG. 8 schematically illustrates a scheme of determining a threshold value for variable node deactivation in a communication system supporting an LDPC code according to an embodiment of the present disclosure.

Referring to FIG. 8, an LDPC decoder may determine a threshold value $t_v$ for variable node deactivation based on a distribution of an initial LLR value $U_{n,ch}$ of a variable node which is received from a channel. That is, the LDPC decoder may determine the threshold value $t_v$ for the variable node deactivation based on a channel signal to noise ratio (SNR).

For example, the LDPC decoder may determine the threshold value $t_v$ for the variable node deactivation as expressed in Equation (6).

$$U_{ch} \sim N(m, 2m), m = \frac{4}{N_0}, \sigma = \sqrt{\frac{8}{N_0}} \rightarrow \boxed{t_v = m + \sigma}$$ Equation (6)

In Equation (6), N0 denotes noise and σ denotes standard deviation.

As expressed in Equation (6), it will be understood that the threshold value $t_v$ for the variable node deactivation may be expressed as a function of a channel SNR.

For example, if a computation result of an MDSDN in FIG. 5 is equal to 1, the LDPC decoder increases the threshold value $t_v$ for the variable node deactivation by real number times, e.g., γ times, and this may be expressed as Equation (7).

$$t_v = t_v + \gamma\sigma$$ Equation (7)

In FIG. 8, the LDPC decoder determines the threshold value $t_v$ for the variable node deactivation based on, for example, the channel SNR. However, the LDPC decoder may use any parameter in which channel quality may be reflected as well as the channel SNR.

A scheme of determining a threshold value for variable node deactivation in a communication system supporting an LDPC code according to an embodiment of the present disclosure has been described with reference to FIG. 8, and a scheme of omitting check node computation for an LLR value of a variable node with a low reliability in a communication system supporting an LDPC code according to an embodiment of the present disclosure will be described with reference to FIG. 9.

Figure 9:
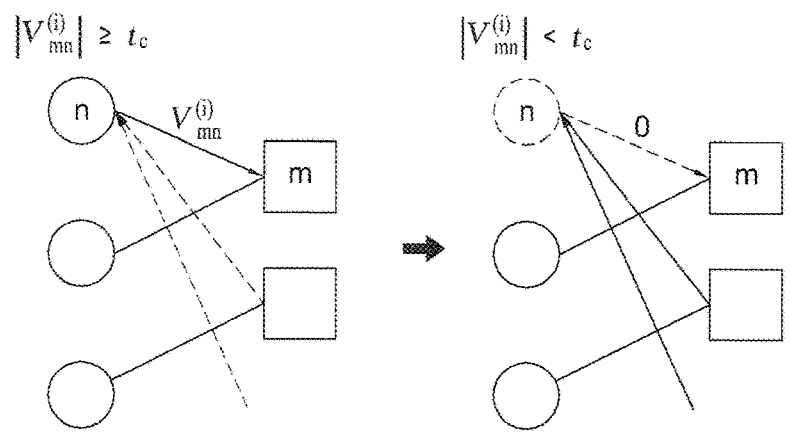
FIG. 9 schematically illustrates a scheme of omitting check node computation for an LLR value of a variable node with a low reliability in a communication system supporting an LDPC code according to an embodiment of the present disclosure.
Figure 9:
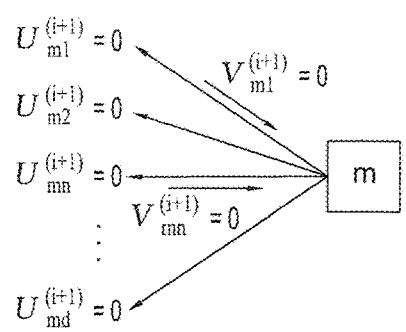

FIG. 9 schematically illustrates a scheme of omitting check node computation for an LLR value of a variable node with a low reliability in a communication system supporting an LDPC code according to an embodiment of the present disclosure.

Referring to FIG. 9, an LDPC decoder changes all V2C messages satisfying a criterion of $|V_{mn}^{(i)}|<t_c$, i.e., all V2C LLR values to zero. That is, update for a deactivated variable node is omitted. Here, tc denotes V2C information, i.e., a threshold value for changing V2C information, i.e., a V2C LLR value.

Alternatively, for variable node update, the LDPC decoder uses all V2C messages, i.e., all V2C LLR values which do not satisfy a criterion of $|V_{mn}^{(i)}|<t_c$, that is, which satisfy a criterion of $|v_{mn}^{(i)}|\geq t_c$.

So, a scheme of omitting check node computation for an LLR value of a variable node with a low reliability as described above may be expressed as Equation (8).

$$\begin{aligned}&(\text{If } |V_{mn}^{(i)}| < t_c) \quad V_{mn}^{(i)} = 0 \\ &(\text{otherwise}) \quad V_{mn}^{(i)} = U_{n,ch}^{(0)} + \sum_{m' \in M(n)\backslash m} U_{mn'n}^{(i)}\end{aligned}$$ Equation (8)

As described in FIG. 9, if a V2C LLR value is changed to zero, check node computation may be omitted. Further, if two or more V2C LLR values are equal to zero in an LDPC decoder which is based on a Min-Sum scheme, all check node computation result are equal to zero. So, it will be understood that check node computation for a check node may be omitted if the two or more V2C LLR values are equal to zero in the LDPC decoder.

A scheme of omitting check node computation for an LLR value of a variable node with a low reliability in a communication system supporting an LDPC code according to an embodiment of the present disclosure has been described with reference to FIG. 9, and an example of a process of omitting check node computation in a communication system supporting an LDPC code according to an embodiment of the present disclosure will be described with reference to FIG. 10.

Figure 10:
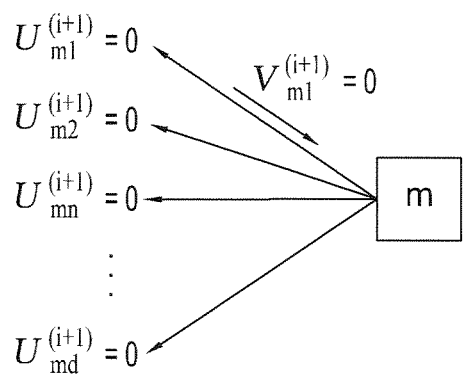
FIG. 10 schematically illustrates an example of a process of omitting check node computation in a communication system supporting an LDPC code according to an embodiment of the present disclosure.

FIG. 10 schematically illustrates an example of a process of omitting check node computation in a communication system supporting an LDPC code according to an embodiment of the present disclosure.

Referring to FIG. 10, it will be noted that a process of omitting check node computation in FIG. 10 is a process of omitting check node computation in a case that a check node degree is dc. Further, it will be noted that a process of omitting check node computation in FIG. 10 is a process of omitting check node computation in a case that there is one V2C information $V_{mn}^{(i)}$ of which a value is equal to zero.

In a general iterative decoding process, if a check node degree is $d_c$, the first minimum (1st minimum) computation and the second minimum (2nd minimum) computation are performed based on dc LLR values. As shown in FIG. 10, if there is one V2C information $V_{mn}^{(i)}$ of which a value is equal to 0, 1st minimum=0, only 2nd minimum computation is required, and dc−1 C2V LLR values which are equal to 0 occur, so some check node computation may be omitted.

An example of a process of omitting check node computation in a communication system supporting an LDPC code according to an embodiment of the present disclosure has been described with reference to FIG. 10, and another example of a process of omitting check node computation in a communication system supporting an LDPC code according to an embodiment of the present disclosure will be described with reference to FIG. 11.

Figure 11:
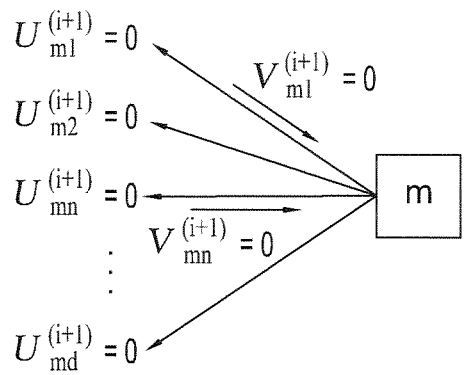
FIG. 11 schematically illustrates another example of a process of omitting check node computation in a communication system supporting an LDPC code according to an embodiment of the present disclosure.

FIG. 11 schematically illustrates another example of a process of omitting check node computation in a communication system supporting an LDPC code according to an embodiment of the present disclosure.

Referring to FIG. 11, it will be noted that a process of omitting check node computation in FIG. 11 is a process of omitting check node computation in a case that a check node degree is dc. Further, it will be noted that a process of omitting check node computation in FIG. 11 is a process of omitting check node computation in a case that there are two or more V2C information $V_{mn}^{(i)}$ of which values are equal to zero.

As described above, in a general iterative decoding process, if a check node degree is dc, 1st minimum computation and 2nd minimum computation are performed based on dc LLR values. As shown in FIG. 11, if there are two or more V2C information $V_{mn}^{(i)}$ of which values are equal to zero, 1st minimum=0 and 2nd minimum=0, and dc C2V LLR values which are equal to zero occur, so all check node computation may be omitted.

Another example of a process of omitting check node computation in a communication system supporting an LDPC code according to an embodiment of the present disclosure has been described with reference to FIG. 11, and an LDPC decoding process in a communication system supporting an LDPC code according to an embodiment of the present disclosure will be described with reference to FIG. 12.

Figure 12:
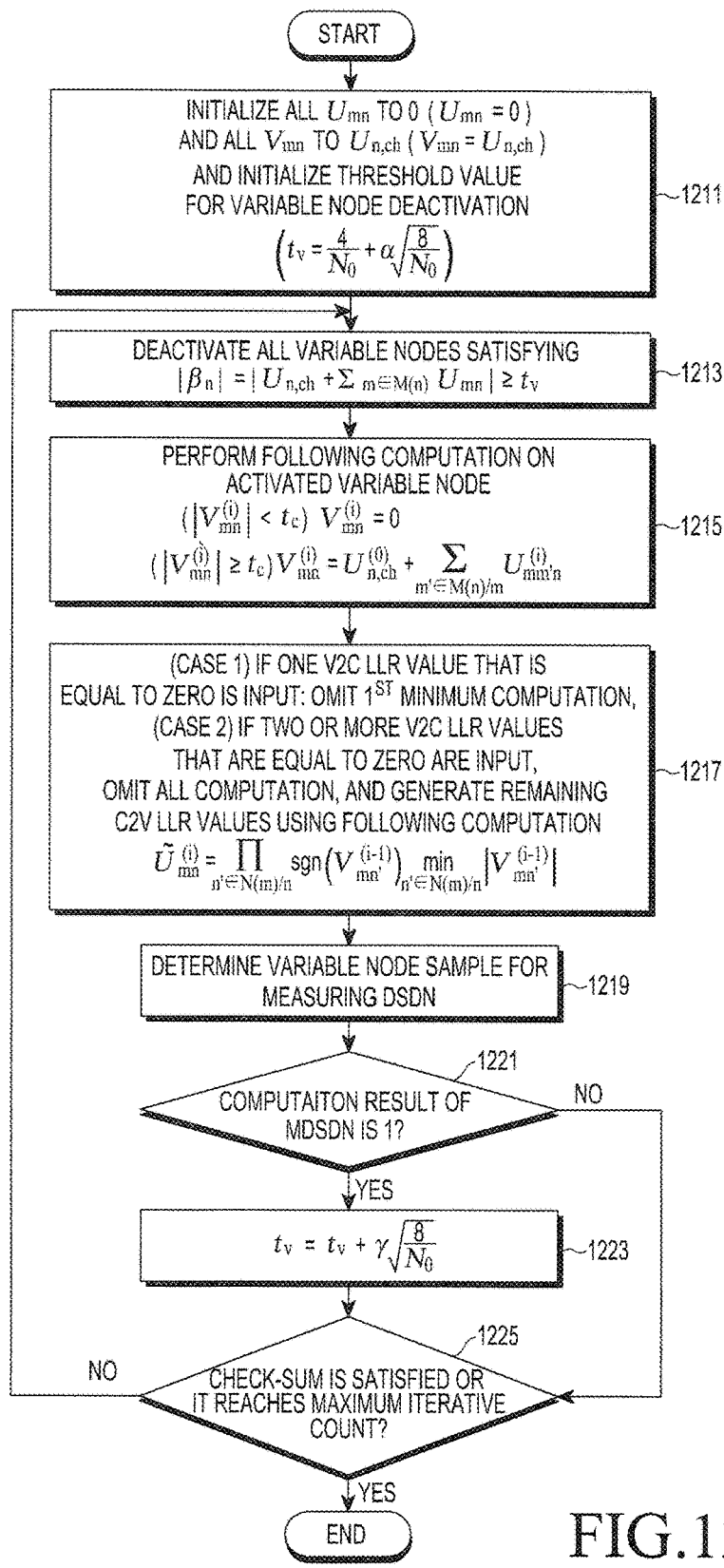
FIG. 12 schematically illustrates an LDPC decoding process in a communication system supporting an LDPC code according to an embodiment of the present disclosure.

FIG. 12 schematically illustrates an LDPC decoding process in a communication system supporting an LDPC code according to an embodiment of the present disclosure.

Referring to FIG. 12, an LDPC decoder initializes all Umn into zero, all Vmn into $U_{n,ch}$, and a threshold value tv for variable node deactivation into $$t_v = \frac{4}{N_0} + \alpha\sqrt{\frac{8}{N_0}}$$

at operation 1211, and proceeds to operation 1213. Here, operation 1213 is the same as operation 113 in FIG. 1, and a detailed description thereof will be omitted herein.

The LDPC decoder performs computation in Equation (9) on an activated variable node at operation 1215, and proceeds to operation 1217.

$$(|V_{mn}^{(i)}| < t_c)V_{mn}^{(i)} = 0 \qquad \text{Equation (9)}$$
$$(|V_{mn}^{(i)}| \geq t_c)V_{mn}^{(i)} = U_{n,ch}^{(0)} + \sum_{m' \in M(n)/m} U_{mm'n}^{(i)}$$

If one V2C LLR value which is equal to zero is input, the LDPC decoder omits 1st minimum computation (Case 1) at operation 1217. If two or more V2C LLR values which are equal to zero are input, the LDPC decoder omits all computation, i.e., all check node computation (Case 2) at operation 1217. The LDPC decoder generates remaining C2V LLR values as expressed in Equation (10) at operation 1217, and proceeds to operation 1219.

$$\tilde{U}_{mn}^{(i)} = \prod_{n' \in N(m)\backslash n} \text{sgn}(V_{mn'}^{(i-1)}) \min_{n' \in N(m)\backslash n} |V_{mn'}^{(i-1)}| \qquad \text{Equation (10)}$$

The LDPC decoder determines variable node samples for measuring a DSDN at operation 1219, and proceeds to operation 1221. The LDPC decoder determines whether a computation result of an MDSDN is equal to a preset value, e.g., 1 at operation 1221. If the computation result of the MDSDN is not equal to 1, the LDPC decoder proceeds to operation 1225. Here, operation 1225 is the same as operation 119 in FIG. 1, and a detailed description thereof will be omitted herein.

If the computation result of the MDSDN is equal to 1, the LDPC decoder proceeds to operation 1223. The LDPC decoder updates a threshold value $t_v$ for variable node deactivation to $$t_v = t_v + \gamma\sqrt{8/N_0},$$

and proceeds to operation 1225.

Meanwhile, each operation in FIG. 12 has been described with reference to other figures, and a detailed description thereof will be omitted herein.

Although FIG. 12 illustrates an LDPC decoding process in a communication system supporting an LDPC code according to an embodiment of the present disclosure, various changes could be made to FIG. 12. For example, although shown as a series of operations, various operations in FIG. 12 could overlap, occur in parallel, occur in a different order, or occur multiple times.

An LDPC decoding process in a communication system supporting an LDPC code according to an embodiment of the present disclosure has been described with reference to FIG. 12, and frame error rate (FER) performance of an LDPC decoding process in a communication system supporting an LDPC code according to an embodiment of the present disclosure will be described with reference to FIG. 13.

Figure 13:
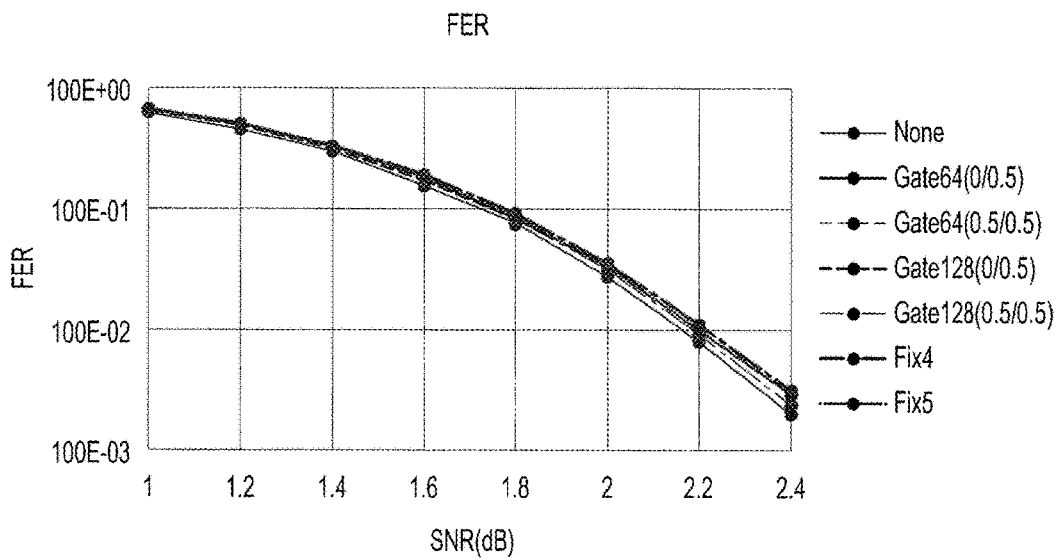
FIG. 13 schematically illustrates FER performance of an LDPC decoding process in a communication system supporting an LDPC code according to an embodiment of the present disclosure.

FIG. 13 schematically illustrates FER performance of an LDPC decoding process in a communication system supporting an LDPC code according to an embodiment of the present disclosure.

Referring to FIG. 13, it will be noted that an FEC performance graph in FIG. 13 is an FEC performance graph in a simulation environment in which n=672, and a code rate=½ in an IEEE 802.11ad (WiGig) system.

An LDPC decoding process according to an embodiment of the present disclosure is performed based on a threshold value $t_v$ for variable node deactivation which is based on a channel SNR, that is, the LDPC decoding process according to an embodiment of the present disclosure is performed based on $$t_v: \frac{4}{N_0} + \alpha\sqrt{\frac{8}{N_0}} \rightarrow t_v + \gamma\sqrt{\frac{8}{N_0}},$$

so it will be understood that FER performance of the LDPC decoding process according to an embodiment of the present disclosure is maintained almost similar to an FER performance of a general LDPC decoding process even though variable node computation amount and check node computation amount are decreased.

In FIG. 13, a criterion of comparing FER performance is a minimum threshold value applicable to a similar FER and an iteration count. In FIG. 13, graphs labeled as "None", "Fix4", and "Fix5" indicate FER performance according to a general LDPC decoding process, and remaining graphs indicate FER performance according to an embodiment of the present disclosure. Further, it will be noted that FER performance of an LDPC decoding process according to an embodiment of the present disclosure is measured in a case of assuming that the number of inputs of an MDSDN is 64 or 128.

FER performance of an LDPC decoding process in a communication system supporting an LDPC code according to an embodiment of the present disclosure has been described with reference to FIG. 13, and an average count of iterations of an LDPC decoding process in a communication system supporting an LDPC code according to an embodiment of the present disclosure will be described with reference to FIG. 14.

Figure 14:
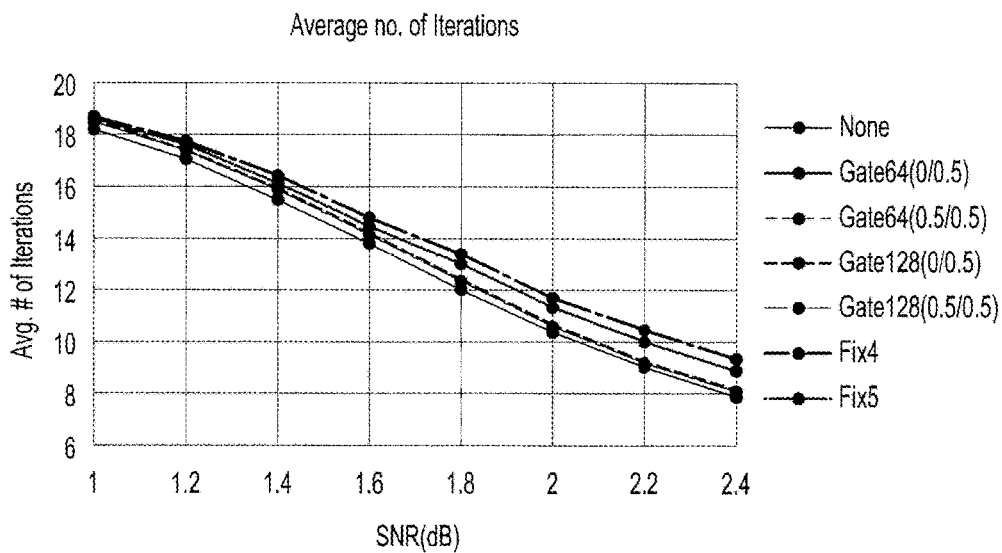
FIG. 14 schematically illustrates an average count of iterations of an LDPC decoding process in a communication system supporting an LDPC code according to an embodiment of the present disclosure.

FIG. 14 schematically illustrates an average count of iterations of an LDPC decoding process in a communication system supporting an LDPC code according to an embodiment of the present disclosure.

Referring to FIG. 14, it will be assumed that a maximum iteration count of an LDPC decoding process is 20 (maximum iteration=20), and it will be understood that an iteration count of an LDPC decoding process according to an embodiment of the present disclosure is almost similar to an iteration count of a general LDPC decoding process.

In FIG. 14, graphs labeled as "None", "Fix4", and "Fix5" indicate an iteration count according to a general LDPC decoding process, and remaining graphs indicate an iteration count of an LDPC decoding process according to an embodiment of the present disclosure. Further, it will be noted that an iteration count of an LDPC decoding process according to an embodiment of the present disclosure is measured in a case of assuming that the number of inputs of an MDSDN is 64 or 128.

An average count of iterations in an LDPC decoding process in a communication system supporting an LDPC code according to an embodiment of the present disclosure has been described with reference to FIG. 14, and variable node computation complexity of an LDPC decoding process in a communication system supporting an LDPC code according to an embodiment of the present disclosure will be described with reference to FIG. 15.

Figure 15:
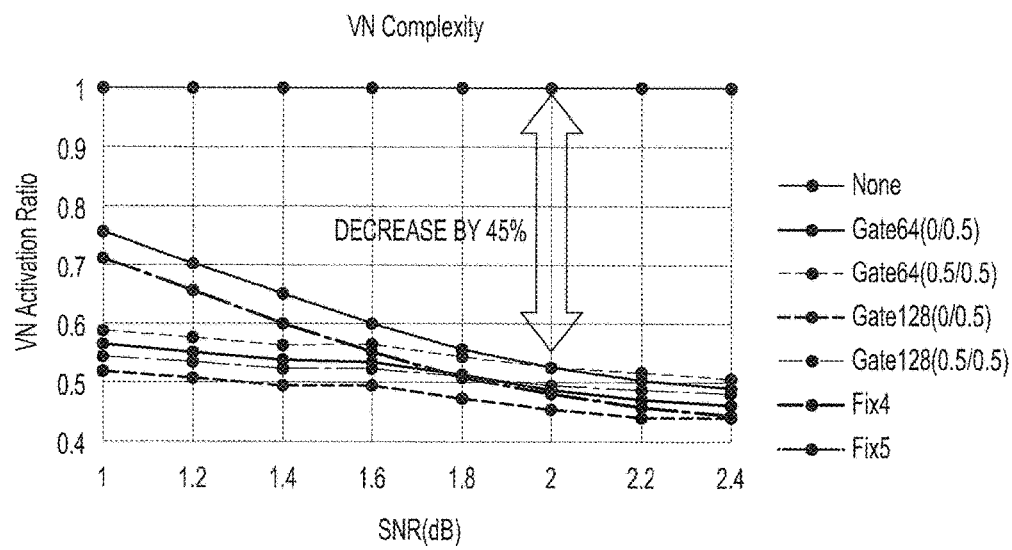
FIG. 15 is a graph schematically illustrating variable node computation complexity of an LDPC decoding process in a communication system supporting an LDPC code according to an embodiment of the present disclosure.

FIG. 15 is a graph schematically illustrating variable node computation complexity of an LDPC decoding process in a communication system supporting an LDPC code according to an embodiment of the present disclosure.

Referring to FIG. 15, it will be understood that variable node computation complexity of an LDPC decoding process according to an embodiment of the present disclosure is decreased by about 45% compared to variable node computation complexity, labeled as "None", of a general LDPC decoding process, e.g., an LDPC decoding process in which a forced convergence scheme is not applied.

Further, in an LDPC decoding process according to an embodiment of the present disclosure, variable node computation amount is not decreased according to a channel SNR. This is why a variable node reactivating criterion, i.e., a threshold value for variable node deactivation is adaptively adjusted.

In FIG. 15, graphs labeled as "None", "Fix4", and "Fix5" indicate an iteration count according to a general LDPC decoding process, and remaining graphs indicate variable node computation complexity of an LDPC decoding process according to an embodiment of the present disclosure. Further, it will be noted that variable node computation complexity of an LDPC decoding process according to an embodiment of the present disclosure is measured in a case of assuming that the number of inputs of an MDSDN is 64 or 128.

Variable node computation complexity of an LDPC decoding process in a communication system supporting an LDPC code according to an embodiment of the present disclosure has been described with reference to FIG. 15, and check node computation complexity of an LDPC decoding process in a communication system supporting an LDPC code according to an embodiment of the present disclosure will be described with reference to FIG. 16.

Figure 16:
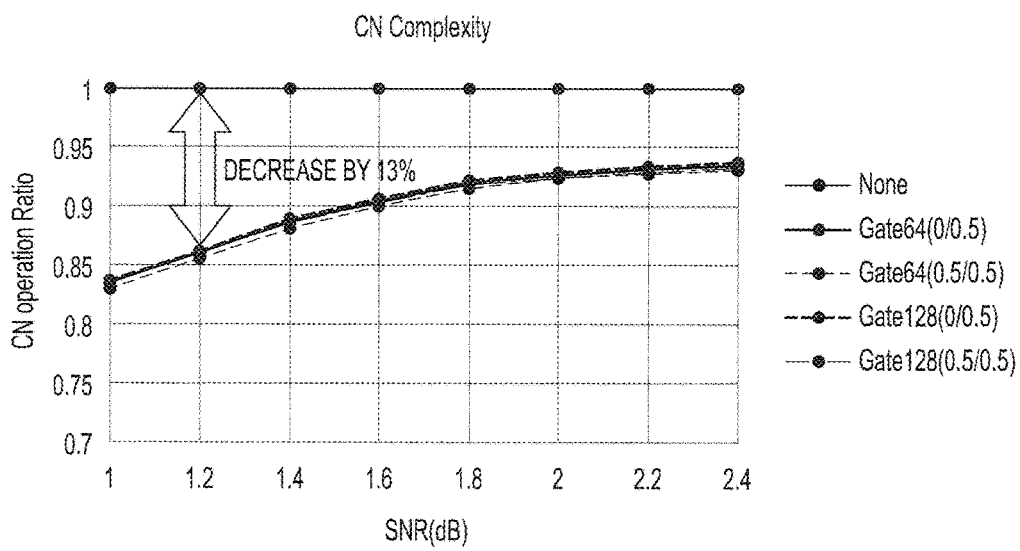
FIG. 16 is a graph schematically illustrating check node computation complexity of an LDPC decoding process in a communication system supporting an LDPC code according to an embodiment of the present disclosure.

FIG. 16 is a graph schematically illustrating check node computation complexity of an LDPC decoding process in a communication system supporting an LDPC code according to an embodiment of the present disclosure.

Referring to FIG. 16, it will be understood that check node computation complexity of an LDPC decoding process according to an embodiment of the present disclosure is decreased by about 13% compared to check node computation complexity, labeled as "None", of a general LDPC decoding process, e.g., an LDPC decoding process in which a forced convergence scheme is not applied.

In FIG. 16, other graphs except for the graph labeled as "None" indicate check node computation complexity of an LDPC decoding process according to an embodiment of the present disclosure. Further, it will be noted that check node computation complexity of an LDPC decoding process according to an embodiment of the present disclosure is measured in a case of assuming that the number of inputs of an MDSDN is 64 or 128.

Check node computation complexity of an LDPC decoding process in a communication system supporting an LDPC code according to an embodiment of the present disclosure has been described with reference to FIG. 16, and an inner structure of a signal receiving apparatus in a communication system supporting an LDPC code according to an embodiment of the present disclosure will be described with reference to FIG. 17.

Figure 17:
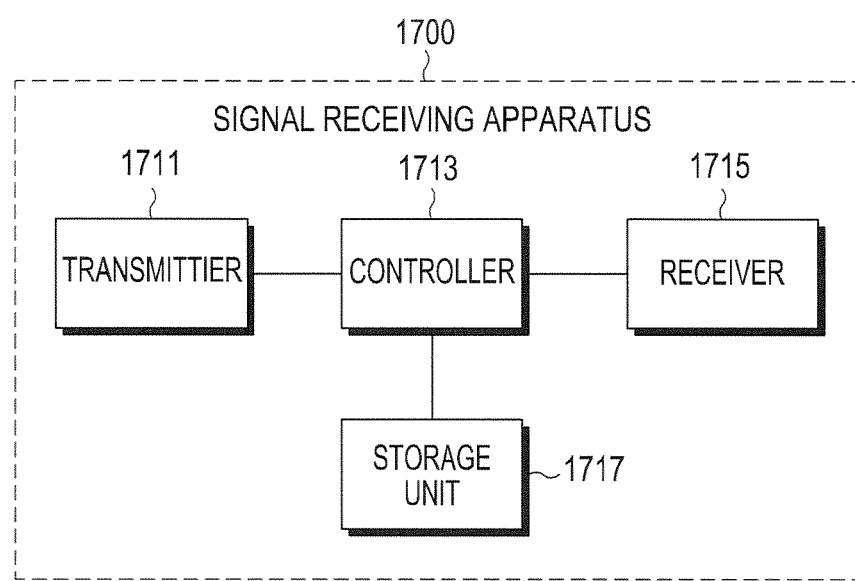
FIG. 17 schematically illustrates an inner structure of a signal receiving apparatus in a communication system supporting an LDPC code according to an embodiment of the present disclosure.

FIG. 17 schematically illustrates an inner structure of a signal receiving apparatus in a communication system supporting an LDPC code according to an embodiment of the present disclosure.

Referring to FIG. 17, a signal receiving apparatus 1700 includes a transmitter 1711, a controller 1713, a receiver 1715, and a storage unit 1717.

The controller 1713 controls the overall operation of the signal receiving apparatus 1700. More particularly, the controller 1713 controls an operation related to an LDPC decoding process of decreasing variable node computation amount and check node computation amount in a communication system supporting an LDPC code according to an embodiment of the present disclosure. The LDPC decoding process of decreasing the variable node computation amount and the check node computation amount in the communication system supporting the LDPC code according to an embodiment of the present disclosure has been described with reference to FIGS. 1 to 16 and a detailed description thereof will be omitted herein.

The transmitter 1711 transmits various signals and various messages to other devices, e.g., a signal transmitting apparatus, and/or the like included in the communication system under a control of the controller 1713. The various signals and various messages transmitted in the transmitter 1711 have been described with reference to FIGS. 1 to 16 and a detailed description thereof will be omitted herein.

The receiver 1715 receives various signals and various messages from other devices, e.g., a signal transmitting apparatus, and/or the like included in the communication under a control of the controller 1713. The various signals and various messages received in the receiver 1715 have been described with reference to FIGS. 1 to 16 and a detailed description thereof will be omitted herein.

The storage unit 1717 stores various programs, various data, and the like related to the LDPC decoding process of decreasing the variable node computation amount and the check node computation amount in the communication system supporting the LDPC code according to an embodiment of the present disclosure under a control of the controller 1713.

The storage unit 1717 stores various signals and various messages which are received by the receiver 1715 from the other devices.

While the transmitter 1711, the controller 1713, the receiver 1715, and the storage unit 1717 are described in the signal receiving apparatus 1700 as separate units, it is to be understood that this is merely for convenience of description. In other words, two or more of the transmitter 1711, the controller 1713, the receiver 1715, and the storage unit 1717 may be incorporated into a single unit.

The signal receiving apparatus 1700 may be implemented with at least one processor such as a central processing unit (CPU).

As is apparent from the foregoing description, an embodiment of the present disclosure enables to receive a signal thereby decreasing power consumption in a communication system supporting an LDPC code.

An embodiment of the present disclosure enables to receive a signal thereby decreasing memory consumption in a communication system supporting an LDPC code.

An embodiment of the present disclosure enables to receive a signal thereby decreasing decoding complexity in a communication system supporting an LDPC code.

An embodiment of the present disclosure enables to receive a signal thereby decreasing variable node computation amount in a communication system supporting an LDPC code.

An embodiment of the present disclosure enables to receive a signal thereby decreasing check node computation amount in a communication system supporting an LDPC code.

An embodiment of the present disclosure enables to receive a signal by adaptively adjusting an LLR threshold value used in an iterative decoding process in a communication system supporting an LDPC code.

Certain aspects of the present disclosure may also be embodied as computer readable code on a non-transitory computer readable recording medium. A non-transitory computer readable recording medium is any data storage device that can store data, which can be thereafter read by a computer system. Examples of the non-transitory computer readable recording medium include read only memory (ROM), random access memory (RAM), CD-ROMs, magnetic tapes, floppy disks, optical data storage devices, and carrier waves (such as data transmission through the Internet). The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

It can be appreciated that a method and apparatus according to an embodiment of the present disclosure may be implemented by hardware, software and/or a combination thereof. The software may be stored in a non-volatile storage, for example, an erasable or re-writable ROM, a memory, for example, a RAM, a memory chip, a memory device, or a memory integrated circuit (IC), or an optically or magnetically recordable non-transitory machine-readable (e.g., computer-readable), storage medium (e.g., a compact disk (CD), a digital video disc (DVD), a magnetic disk, a magnetic tape, and/or the like). A method and apparatus according to an embodiment of the present disclosure may be implemented by a computer or a mobile terminal that includes a controller and a memory, and the memory may be an example of a non-transitory machine-readable (e.g., computer-readable), storage medium suitable to store a program or programs including instructions for implementing various embodiments of the present disclosure.

The present disclosure may include a program including code for implementing the apparatus and method as defined by the appended claims, and a non-transitory machine-readable (e.g., computer-readable), storage medium storing the program. The program may be electronically transferred via any media, such as communication signals, which are transmitted through wired and/or wireless connections, and the present disclosure may include their equivalents.

An apparatus according to an embodiment of the present disclosure may receive the program from a program providing device which is connected to the apparatus via a wire or a wireless and store the program. The program providing device may include a memory for storing instructions which instruct to perform a content protect method which has been already installed, information necessary for the content protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

Although the present disclosure has been described with exemplary embodiments, various changes and modifications may be suggested to one skilled in the art. It is intended that the present disclosure encompass such changes and modifications as fall within the scope of the appended claims.

What is claimed is:

1. A method of a receiving apparatus in a communication system supporting a low density parity check (LDPC) code, the method comprising:
   deactivating first variable nodes of which absolute values of log likelihood ratio (LLR) values are greater than or equal to a first threshold value;
   changing one or more LLR values of one or more second variable nodes of which absolute values of the LLR values are less than a second threshold value among third variable nodes other than the deactivated first variable nodes to a first preset value indicating a zero value, the second threshold value used for omitting check node computation for the one or more LLR values of the one or more second variable nodes with a low reliability relatively among the third variable nodes; and
   determining LLR values of check nodes based on the LLR values of the variable nodes other than the deactivated first variable nodes,
   wherein one or more check node computations are omitted if the one or more LLR values are changed to the zero value.

2. The method of claim 1, further comprising:
   determining whether to adjust the first threshold value based on a ratio of the deactivated first variable nodes to total variable nodes and a third threshold value.

3. The method of claim 2, wherein the determining of whether to adjust the first threshold value based on the ratio of the deactivated first variable nodes to the total variable nodes and the third threshold value comprises:
increasing the first threshold value, if the ratio of the deactivated first variable nodes to the total variable nodes is greater than or equal to the third threshold value; and
decreasing the first threshold value, if the ratio of the deactivated first variable nodes to the total variable nodes is less than the third threshold value.

4. The method of claim 3, wherein the first threshold value is determined based on channel quality.

5. The method of claim 3, wherein the first threshold value is determined based on noise and standard deviation.

6. The method of claim 3, wherein the ratio of the deactivated first variable nodes to the total variable nodes is determined by considering sampled variable nodes among the total variable nodes.

7. The method of claim 2, wherein the determining of whether to adjust the first threshold value based on the ratio of the deactivated first variable nodes to the total variable nodes and the third threshold value comprises:
increasing the first threshold value by a second preset value, if the ratio of the deactivated first variable nodes to the total variable nodes is equal to the third threshold value,
wherein the first threshold value is determined based on noise and standard deviation, and
wherein the second preset value is determined based on the noise and the standard deviation.

8. The method of claim 7, wherein the first threshold value is determined based on channel quality.

9. The method of claim 7, wherein the ratio of the deactivated first variable nodes to the total variable nodes is determined by considering sampled variable nodes among the total variable nodes.

10. A receiving apparatus in a communication system supporting a low density parity check (LDPC) code, the receiving apparatus comprising:
a processor configured to:
deactivate first variable nodes of which absolute values of log likelihood ratio (LLR) values are greater than or equal to a first threshold value;
change one or more LLR values of one or more second variable nodes of which absolute values of the LLR values are less than a second threshold value among third variable nodes other than the deactivated first variable nodes to a first preset value indicating a zero value, the second threshold value used for omitting check node computation for the one or more LLR values of the one or more second variable nodes with a low reliability relatively among the third variable nodes; and
determine LLR values of check nodes based on the LLR values including the first preset value indicating the zero value of the variable nodes other than the deactivated first variable nodes,
wherein one or more check node computations are omitted if the one or more LLR values are changed to the zero value.

11. The receiving apparatus of claim 10, wherein the processor is configured to determine whether to adjust the first threshold value based on a ratio of the deactivated first variable nodes to total variable nodes and a third threshold value.

12. The receiving apparatus of claim 11, wherein the processor is configured to:
increase the first threshold value, if the ratio of the deactivated first variable nodes to the total variable nodes is greater than or equal to the third threshold value; and
decrease the first threshold value, if the ratio of the deactivated first variable nodes to the total variable nodes is less than the third threshold value.

13. The receiving apparatus of claim 12, wherein the first threshold value is determined based on channel quality.

14. The receiving apparatus of claim 12, wherein the first threshold value is determined based on noise and standard deviation.

15. The receiving apparatus of claim 12, wherein the ratio of the deactivated first variable nodes to the total variable nodes is determined by considering sampled variable nodes among the total variable nodes.

16. The receiving apparatus of claim 11, wherein the processor is configured to:
increase the first threshold value by a second preset value, if the ratio of the deactivated first variable nodes to the total variable nodes is equal to the third threshold value,
wherein the first threshold value is determined based on noise and standard deviation, and
wherein the second preset value is determined based on the noise and the standard deviation.

17. The receiving apparatus of claim 16, wherein the first threshold value is determined based on channel quality.

18. The receiving apparatus of claim 16, wherein the ratio of the deactivated first variable nodes to the total variable nodes is determined by considering sampled variable nodes among the total variable nodes.

* * * * *